(12) United States Patent
Chen

(10) Patent No.: US 7,470,942 B2
(45) Date of Patent: Dec. 30, 2008

(54) THIN FILM TRANSISTOR ARRAY AND ELECTROSTATIC DISCHARGE PROTECTIVE DEVICE THEREOF

(75) Inventor: Chen-Ming Chen, Taichung (TW)

(73) Assignee: Chunghwa Picture Tube., Ltd., Taoyuan (TW)

( * ) Notice: Subject to any disclaimer, the term of this patent is extended or adjusted under 35 U.S.C. 154(b) by 462 days.

(21) Appl. No.: 11/162,327

(22) Filed: Sep. 7, 2005

(65) Prior Publication Data

US 2007/0090410 A1    Apr. 26, 2007

(51) Int. Cl.
| | | |
|---|---|---|
| H01L 27/148 | (2006.01) | |
| H01L 29/768 | (2006.01) | |
| H01L 23/62 | (2006.01) | |
| H01L 29/04 | (2006.01) | |
| H01L 31/036 | (2006.01) | |

(52) U.S. Cl. .................. 257/223; 257/355; 257/59; 257/360

(58) Field of Classification Search ............ 257/774, 257/223, 59, 401, 362, 355, 359, 360, 357, 257/173, 290–292, 655, 530

See application file for complete search history.

(56) References Cited

U.S. PATENT DOCUMENTS

| | | | |
|---|---|---|---|
| 5,652,632 A | 7/1997 | Shimizu | ............ 349/40 |
| 6,013,923 A | 1/2000 | Huang | |
| 6,100,949 A | 8/2000 | Kim | |
| 2004/0121516 A1* | 6/2004 | Yamazaki et al. | ............ 438/106 |
| 2004/0217424 A1 | 11/2004 | Shih | ............ 257/355 |
| 2006/0077162 A1 | 4/2006 | Chou et al. | |

FOREIGN PATENT DOCUMENTS

EP    0423824 A2    4/1991

\* cited by examiner

*Primary Examiner*—Chuong A. Luu
(74) *Attorney, Agent, or Firm*—Jianq Chyun IP Office

(57) ABSTRACT

A thin film transistor array, an electrostatic discharge protective device thereof, and methods for fabricating the same are provided. The thin film transistor array comprises a plurality of scan lines, a plurality of data lines, a first shorting bar, and a second shorting bar. The electrostatic discharge protective device comprises a switching device and a resistance line in parallel. If static electricity accumulated on the TFT array is over a predetermined range, the accumulated static electricity will be conducted to the first or second shorting bar via the switching device. The resistance line can prevent signals applied to one of the scan lines or data lines from being conducted to other scan lines or data lines, to detect a defective pixel.

16 Claims, 16 Drawing Sheets

THIN FILM TRANSISTOR ARRAY AND ELECTROSTATIC DISCHARGE PROTECTIVE DEVICE THEREOF

BACKGROUND OF THE INVENTION

1. Field of the Invention

The present invention generally relates to a thin film transistor (TFT) array and a fabricating method thereof. More particularly, the present invention relates to a top-gate TFT array, an ESD protective device thereof, and methods for fabricating the same.

2. Description of Related Art

Electrostatic discharge is a phenomenon that electrostatic charge moves along the surface of a non-conductive material, which might damage circuit devices in an integrated circuit and other circuitry. For instance, when a human being is walking on a carpet, hundreds or even thousands of voltages of electrostatic potential might be detected under high relative humidity, whereas even tens of thousands of voltages might be detected under low relative humidity.

During a fabrication process of a liquid crystal display (LCD), relevant machinery platforms and technicians under operation can carry electrostatic charges, thus when these charge bearers contact the LCD panels, an electrostatic discharge event might take place, and the momentary discharge might harm the LCD devices and permanently disable the circuitry.

In order to avoid TFTs and circuitry damage caused by ESD, an ESD circuit is generally equipped on a LCD panel. Wherein, scan lines are connected to a common driving signal line, and the data lines are connected to a common data signal line. The common driving signal line and the common data signal line are connected to ground terminals. Therefore, when the amount of the accumulated static electricity is over a predetermined range, the accumulated static electricity can be dispelled through the ground terminals to avoid TFTs and circuitry damage caused by ESD.

In addition, when performing an electric test on the pixels of the LCD panel, a first voltage is applied to one of the scan lines to turn on the TFTs on the selected scan line. Then, a second voltage is applied to one of the data lines to thereby write data into a test pixel. However, since the scan lines and the data lines are electrically connected to common driving signal line and the common data signal line respectively, the first voltage is applied via the common driving signal line to the other scan lines, and the second voltage is applied via the common data signal line to the other data lines. Conversely, when a voltage is applied to the scan line to thereby read the data of the testing pixel from the data line, the voltage is applied via the common driving signal line to other scan lines, and it is impossible to derive a voltage peculiar to the pixel. Thus, it is impossible to detect a defective pixel.

SUMMARY OF THE INVENTION

Accordingly, the present invention is directed to a TFT array and an ESD protective device thereof, which can prevent devices on TFT array from ESD damage, and is impossible to detect a defective pixel.

The present invention is further directed to methods for fabricating a TFT array and an ESD protective device thereof, wherein a conductive path is provided for dispelling accumulated static electricity, and it is impossible to detect a defective pixel.

The present invention provides a TFT array, which comprises a substrate, a plurality of data lines and scan lines, a plurality of pixel structures, a first shorting bar, a second shorting bar, a plurality of first island structures, a plurality of second island structures, a gate insulating layer, a dielectric interlayer, a plurality of first connecting lines, a plurality of second connecting lines, a passivation layer, a plurality of first resistance lines, and a plurality of second resistance lines.

The substrate has a display region and a peripheral circuit region, and the data lines and the scan lines are disposed in the display region for defining a plurality of pixel regions. The pixel structures are disposed in the pixel regions and driven by the data lines and the scan lines, wherein each pixel structure comprises: a top-gate TFT, electrically connected to one of the data lines and one of the scan lines; and a pixel electrode, disposed over and electrically connected to the top-gate TFT.

The first shorting bar is disposed in the peripheral circuit region, and the second shorting bar is disposed in the peripheral circuit region. The first island structures are disposed on the substrate and between the scan lines and the first shorting bar. The second island structures are disposed on the substrate and between the data lines and the second shorting bar. The gate insulating layer is disposed on the substrate and covering the first island structures, the second island structures, and semiconductor layers of the top-gate TFTs. The dielectric interlayer is disposed on the gate insulating layer and covering the scan lines, the first shorting bar, and gates of the top-gate TFTs, wherein the gate insulating layer and the dielectric interlayer have a plurality of first contact windows over the scan lines, the first island structures, and the first shorting bar, and have a plurality of second contact windows over the second island structures, wherein the data lines and the second shorting bar are disposed on the dielectric interlayer and extends over the second island structures to be electrically connected to the second island structures via the second contact windows. The first connecting lines are disposed on the dielectric interlayer and electrically connected between the first island structures and the scan lines via the first contact windows. The second connecting lines are disposed on the dielectric interlayer and electrically connected between the first island structures and the shorting bar via the first contact windows.

The passivation layer covers the data lines, the second shorting bar, and source/drains of the top-gate TFTs, wherein the passivation layer has a plurality of third contact windows over the first connecting lines and the second connecting lines, and has a plurality of fourth contact windows over the data lines and the second shorting bar. The first resistance lines are disposed on the passivation layer and electrically connected between one of the first connecting lines and one of the second connecting lines via the third contact windows respectively. The second resistance lines are disposed on the passivation layer and electrically connected between one of the data lines and the second shorting bar via the fourth contact windows respectively.

According to an embodiment of the present invention, the gates of the top-gate TFTs, the scan lines, and the first shorting bar are made of a same material.

According to an embodiment of the present invention, the semiconductor layers, the first island structures, and the second island structures are made of a same material. For example, the semiconductor layers, the first island structures, and the second island structures are made of low temperature poly-silicon (LTPS).

According to an embodiment of the present invention, the source/drains of the top-gate TFTs, the data lines, the second shorting bar, the first connecting lines, and the second connecting lines are made of a same material.

The present invention provides a method for fabricating a TFT array. First, a substrate is provided, wherein the substrate has a plurality of pixel regions defined thereon. Then, a semiconductor material layer is formed on the substrate and then patterned to form a semiconductor layer in each pixel region respectively and form a plurality of first island structures and a plurality of second island structures at two adjacent sides of the pixel regions respectively. Next, a gate insulating layer is formed on the substrate to cover the semiconductor layers, the first island structures, and the second island structures. Then, a first metal layer is formed on the gate insulating layer and then patterned to form a plurality of gates, a plurality of scan lines, a plurality of first connecting parts, and a first shorting bar, wherein the gates are disposed on the semiconductor layers, the scan lines are connected to the gates, and two ends of each first connecting part are connected to the first shorting bar and one of the scan lines.

Thereafter, an ion implantation is performed to form a source/drain doped region in each semiconductor layer. Then, a dielectric interlayer is formed on the first metal layer and the gate insulating layer and then patterned to form a plurality of first contact windows in the dielectric interlayer corresponding to the source/drain doped regions, the scan lines, the first island structures, the second island structures, and the first shorting bar, and form a plurality of first openings in the dielectric interlayer corresponding to the first connecting parts.

Next, a second metal layer is formed on the dielectric interlayer and then patterned to form a plurality of source/drains, a plurality of first connecting lines, a plurality of second connecting lines, a plurality of data lines, a plurality of second connecting parts, and a second shorting bar. Wherein, each source/drain is electrically connected to one of the source/drain doped region via the first contact windows, two ends of each first connecting line are electrically connected to one of the scan lines and one of the first island structures respectively via the first contact windows, two ends of each second connecting line are electrically connected to one of the first island structures and the first shorting bar respectively via the first contact windows, each data line is electrically connected to one of the sources, and two ends of each second connecting part are electrically connected to one of the data lines and the second shorting bar respectively.

Then, a passivation layer is formed on the second metal layer and the dielectric interlayer and then patterned to form a plurality of second openings in the passivation layer corresponding to the first openings, a plurality of third openings in the passivation layer corresponding to the second connecting parts, and a plurality of second contact windows in the passivation layer corresponding to the drains, the first connecting lines, the second connecting lines, the data lines, and the second shorting bar. Next, a conductive layer is formed on the passivation layer and then patterned to form a plurality of pixel electrodes, a plurality of first resistance lines, and a plurality of second resistance lines, wherein each pixel electrode is electrically connected to one of the drains via one of the second contact windows, two ends of each first resistance lines are electrically connected to one of the first connecting lines and one of the second connecting lines respectively via the second contact windows, and two ends of each second resistance lines are electrically connected to one of the data lines and the second shorting bar respectively via the second contact windows. After that, the first connecting parts and the second connecting parts are removed.

According to an embodiment of the present invention, the step of removing the first connecting parts and the second connecting parts comprises performing dry etching or wet etching to remove the first connecting parts and the second connecting parts exposed by the second openings and the third openings.

The present invention provides an ESD protective device of a TFT array, wherein the ESD protective device is electrically connected between a scan line and a first shorting bar on a substrate. The ESD protective device comprises a first island structure, a gate insulating layer, a dielectric interlayer, a metal layer, a passivation layer, and a conductive layer.

The first island structure is disposed on the substrate and between the scan line and the first shorting bar. The gate insulating layer is disposed on the substrate and covering the first island structure. The dielectric interlayer is disposed on the gate insulating layer, wherein the dielectric interlayer and the gate insulating layer have a plurality of first contact windows corresponding to the scan line, the first island structure, and the first shorting bar. The metal layer is disposed on the dielectric interlayer and comprising a first connecting line and a second connecting line, wherein two ends of the first connecting line are electrically connected to the scan line and the first island structure respectively via the first contact windows, and two ends of the second connecting line are electrically connected to the first island structure and the first shorting bar respectively via the first contact windows.

In addition, the passivation layer is disposed on the metal layer and having a plurality of second contact windows corresponding to the first connecting line and the second connecting line. The conductive layer is disposed on the passivation layer and comprising a resistance line, wherein two ends of the resistance line are electrically connected to the first connecting line and the second connecting line respectively via the second contact windows.

According to an embodiment of the present invention, the first island structure is made of LTPS.

According to an embodiment of the present invention, the ESD protective device further comprises a first ground terminal, which is electrically connected to the first shorting bar.

According to an embodiment of the present invention, the resistance line takes a shape of zigzag.

According to an embodiment of the present invention, the conductive layer is made of metal, metal alloy, indium tin oxide (ITO), or indium zinc oxide (IZO).

The present invention provides a method for fabricating an ESD protective device of a TFT array. First, a substrate is provided. Then, a semiconductor material layer is formed on the substrate and then patterned to form a first island structure. Next, a gate insulating layer is formed on the substrate to cover the first island structure. Then, a first metal layer is formed on the gate insulating layer and then patterned to form a scan line, a first connecting part, and a first shorting bar, wherein two ends of the first connecting part are electrically connected to the scan line and the first shorting bar respectively. Thereafter, a dielectric interlayer is formed on the first metal layer and then patterned to form a plurality of first contact windows in the dielectric interlayer corresponding to the scan line, the first island structure, and the first shorting bar, and form a first opening in the dielectric interlayer corresponding to the first connecting part.

Then, a second metal layer is formed on the dielectric interlayer and then patterned to form a first connecting line and a second connecting line, wherein two ends of the first connecting line are electrically connected to the scan line and the first island structure respectively via the first contact windows, and two ends of the second connecting line are electrically connected to the first island structure and the first shorting bar respectively via the first contact windows. Then, a passivation layer is formed on the second metal layer and then patterned to form a second opening in the passivation layer corresponding to the first opening, and form a plurality of second contact windows in the passivation layer corresponding to the first connecting line and the second connecting line. Next, a conductive layer is formed on the passivation layer and then patterned to form a resistance line, wherein two ends of the resistance line are electrically connected to the first connecting line and the second connecting line respectively via the second contact windows. After that, the first connecting part is removed.

According to an embodiment of the present invention, the step of removing the first connecting part comprises performing dry etching or wet etching to remove the first connecting part exposed by the second opening.

The present invention provides an ESD protective device of a TFT array, wherein the ESD protective device is electrically connected between a data line and a second shorting bar on a substrate. The ESD protective device comprises a second island structure, an insulating layer, a passivation layer, and a conductive layer.

The second island structure is disposed on the substrate and between the data line and the second shorting bar. The insulating layer is disposed on the substrate and covering the second island structure, wherein the insulating layer has a plurality of first contact windows corresponding to the second island structure, and the data line and the second shorting bar extend over the second island structure to be electrically connected to the second island structure via the first contact windows. The passivation layer is disposed over the data line, the second island structure, and the second shorting bar, wherein the passivation has a plurality of second contact windows corresponding to the data line and the second shorting bar. The conductive layer is disposed on the passivation layer and comprising a resistance line, wherein two ends of the resistance line are electrically connected to the data line and the second shorting bar respectively via the second contact windows.

According to an embodiment of the present invention, the second island structure is made of LTPS.

According to an embodiment of the present invention, the insulating layer comprises a gate insulating layer and a dielectric inter layer.

According to an embodiment of the present invention, the ESD protective device further comprises a second ground terminal, which is electrically connected to the second shorting bar.

According to an embodiment of the present invention, the resistance line takes a shape of zigzag.

According to an embodiment of the present invention, the conductive layer is made of metal, metal alloy, indium tin oxide (ITO), indium zinc oxide (IZO).

The present invention provides a method for fabricating an ESD protective device of a TFT array. First, a substrate is provided. Then, a semiconductor material layer is formed on the substrate and then patterned to form a second island structure. Next, a insulating layer is formed on the substrate and then patterned to form a plurality of first contact windows in the insulating layer corresponding to the second island structure. Then, a metal layer is formed on the insulating layer and then patterned to form a data line, a second connecting part, and a second shorting bar, wherein the data line and the second shorting bar extend over the second island structure to be electrically connected to the second island structure via the first contact windows, and two ends of the second connecting part are electrically connected to the data line and the second shorting bar respectively. Next, a passivation layer is formed on the metal layer and then patterned to form an opening in the passivation layer corresponding to the second connecting part, and form a plurality of second contact windows in the passivation layer corresponding to the data line and the second shorting bar. Then, a conductive layer is formed on the passivation layer and then patterned to form a resistance line, wherein two ends of the resistance line are electrically connected to the data line and the second shorting bar respectively via the second contact windows. After that, the second connecting part is removed.

According to an embodiment of the present invention, the steps of forming the insulating layer comprise forming a gate insulating layer on the substrate; and forming a dielectric interlayer on the gate insulating layer.

According to an embodiment of the present invention, the step of removing the second connecting part comprises performing dry etching or wet etching to remove the second connecting part exposed by the opening.

Since the invention can be applied to the present manufacturing process of LTPS TFT to fabricate ESD protective devices between each scan line and the first shorting bar and between each data line and the second shorting bar, ESD protective ability on the top-gate TFT array can therefore be attained without any additional mask process. In addition, the ESD protective device can take effect as each metal/conductive layer is fabricated but not as the whole panel process should be accomplished.

Furthermore, since a signal applied to a specific scan line or data line can be separated from others by the ESD protective device, it is impossible to detect a defective pixel.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
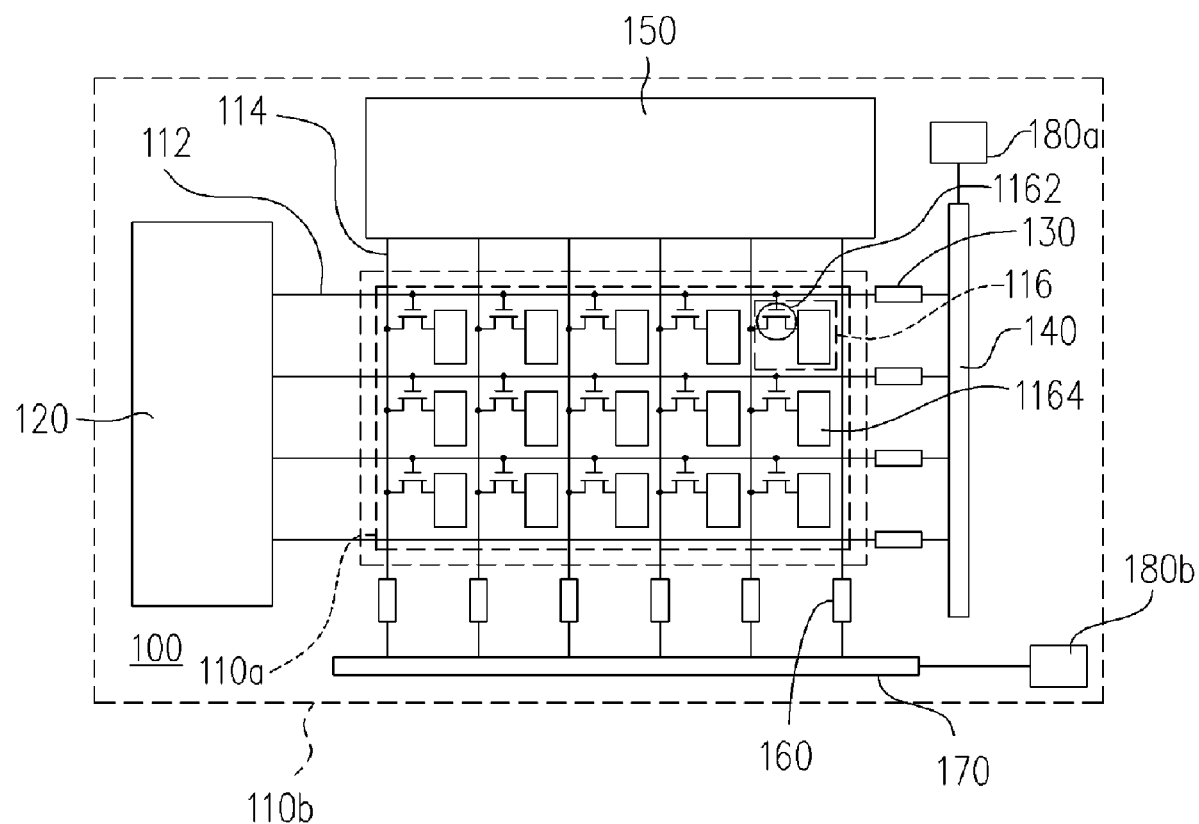
FIG. 1 is a top view illustrating a TFT array and an ESD protective device thereof according to the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a top view illustrating a TFT array and an ESD protective device thereof according to the present invention. Referring to FIG. 1, the TFT array 100 comprises a substrate (not shown), a plurality of scan lines 112, a plurality of data lines, a plurality of pixel structures, a scan driving circuit 120, a plurality of first ESD protective devices 130, a first shorting bar 140, a data driving circuit 150, a plurality of second ESD protective devices 160, and a second shorting bar 170.

The substrate has a display region 110a and a peripheral circuit region 110b. Wherein, the display region 110a is used for display image, and related circuits are disposed in the peripheral circuit region 110b for driving the display region 110a to display image. The scan lines 112 and data lines 114 are disposed in the display region 110a to define a plurality of pixel regions 116 in array.

The pixel structures are disposed in the pixel regions 116 respectively and electrically connected to the scan lines 112 and the data lines 114 to be driven by the scan lines 112 and the data lines 114. Wherein, each pixel structure comprises a top-gate TFT 1162 and a pixel electrode 1164.

Each top-gate TFT 1162 is disposed in the corresponding pixel region 116, and electrically connected to the scan lines 112 and the data lines 114. Each pixel electrode 1164 is disposed over the corresponding top-gate TFT 1162 and electrically connected thereto.

The scan driving circuit 120 is disposed in the peripheral circuit region 110b for applying signals thereto to turn the corresponding top-gate TFT 1162 on or off. The first ESD protective devices 130 and the first shorting bar 140 are disposed at a side of the scan lines 112. Wherein, each first ESD protective device 130 is electrically connected to one of the scan lines 112. When the amount of the accumulated static electricity is over a predetermined range, the first ESD protective devices 130 and the first shorting bar 140 can form a conductive path to dispel the accumulated static electricity. Therefore, the top-gate TFTs 1162 can be protected form the ESD damage.

Similarly, the data driving circuit 150 is disposed in the peripheral circuit region 110b for inputting data to the corresponding pixel electrode 1164. The second ESD protective devices 160 and the second shorting bar 170 are disposed at a side of the data lines 114. Wherein, each second ESD protective device 160 is electrically connected to one of the data lines 114. When the amount of the accumulated static electricity is over a predetermined range, the second ESD protective devices 160 and the second shorting bar 170 can form a conductive path to dispel the accumulated static electricity. Therefore, the circuit or electric device on the top-gate TFT array 100 can be protected form the ESD damage.

In an embodiment, the first shorting bar 140 and the second shorting bar are grounding by being electrically connected to a first ground terminal 180a and a second ground terminal 180b respectively.

Figure 2A:
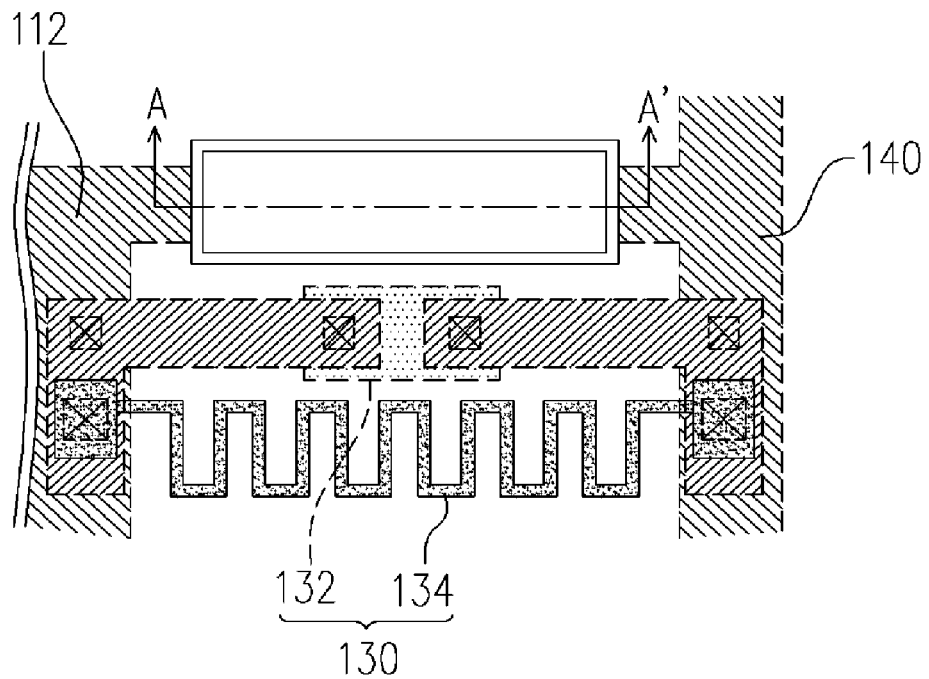
FIGS. 2A and 2B are top views illustrating a first ESD protective device and a second ESD protective device according to the present invention.
Figure 2B:
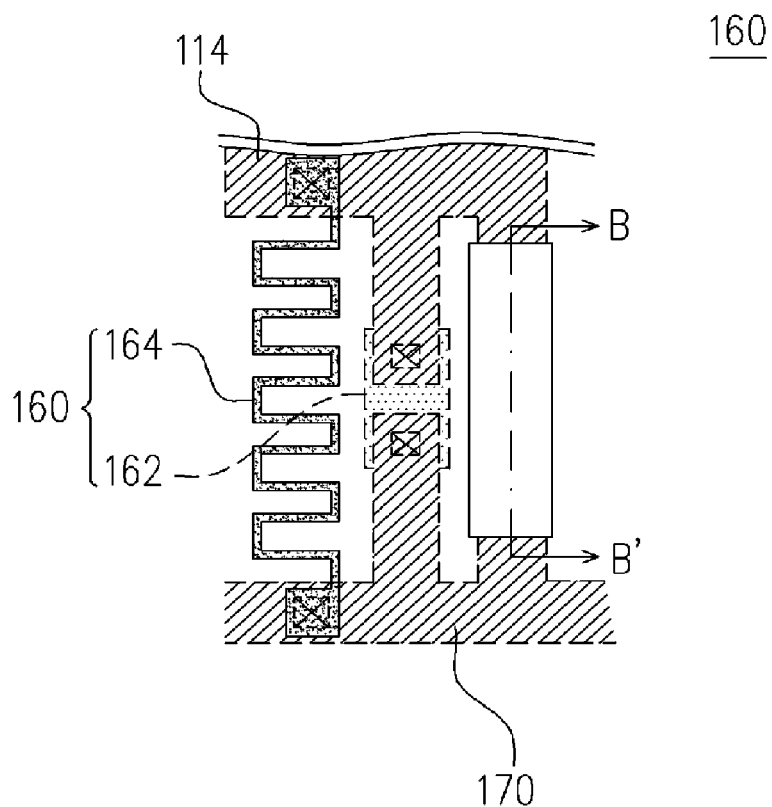

FIGS. 2A and 2B are top views illustrating a first ESD protective device 130 and a second ESD protective device 160 according to the present invention. Referring to FIGS. 2A and 2B, the first ESD protective device 130 has a first switching device 132 and a first resistance line 134 in parallel. Similarly, the second ESD protective device 160 has a second switching device 162 and a second resistance line 164 in parallel.

When the amount of the static electricity accumulated on the devices or circuit of the panel is over a predetermined range, the first switching device 132 or the second switching device 162 is turned on to form a conductive path and conduct the accumulated static electricity into the first shorting bar 140 or the second shorting bar 170.

In addition, when transmitting a scan signal or a data signal to the corresponding top-gate TFT 1162 or the corresponding pixel electrode 1164, the voltage of the scan signal or the data signal will reduced by the first resistance line 134 or the second resistance line 164. The signal will not be transmitted to other scan lines 112 or data lines 114, and thus it is impossible to detect a defective pixel.

In an embodiment of the present invention, the first ESD protective device 130, the first shorting bar 140, the second ESD protective device 160, and the second shorting bar 170 can be fabricated simultaneously with the top-gate TFT 1162 on the top-gate TFT array 100. Detailed process will be described in three parts in the following paragraphs.

FIGS. 3A through 3H are cross-sectional views illustrating a manufacturing process of one of the top-gate TFTs 1162 shown in FIG. 1. FIGS. 4A through 4F are top views illustrating a manufacturing process of one of the first ESD protective devices 130 and one of the first shorting bar 140 shown in FIG. 2A. FIGS. 5A through 5E are top views illustrating a manufacturing process of one of the second ESD protective devices 160 and one of the second shorting bar 170 shown in FIG. 2B.

Figure 3A:
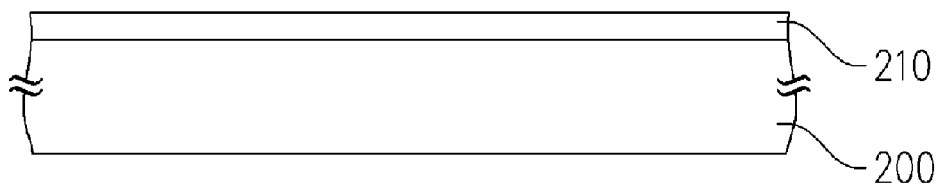
FIGS. 3A through 3H are cross-sectional views illustrating a manufacturing process of one of the top-gate TFTs shown in FIG. 1.

First, referring to FIG. 3A, a substrate 200 having a plurality of pixel regions thereon is provided. Wherein, a buffer layer 210 is formed on the substrate 200.

Figure 3B:
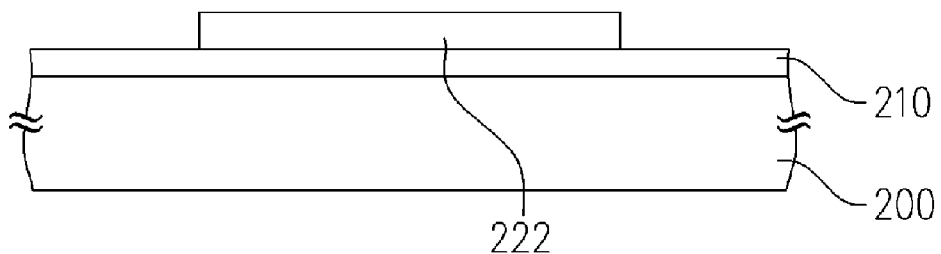
Figure 4A:
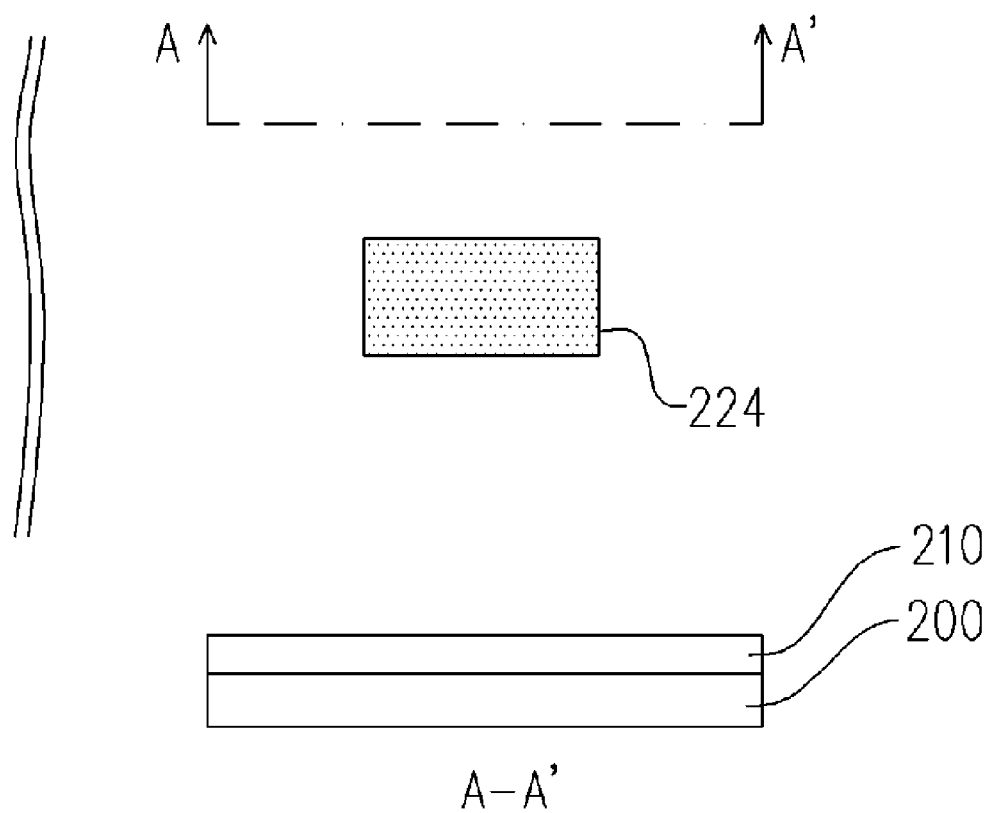
FIGS. 4A through 4F are top views illustrating a manufacturing process of one of the first ESD protective devices and one of the first shorting bar shown in FIG. 2A.
Figure 5A:
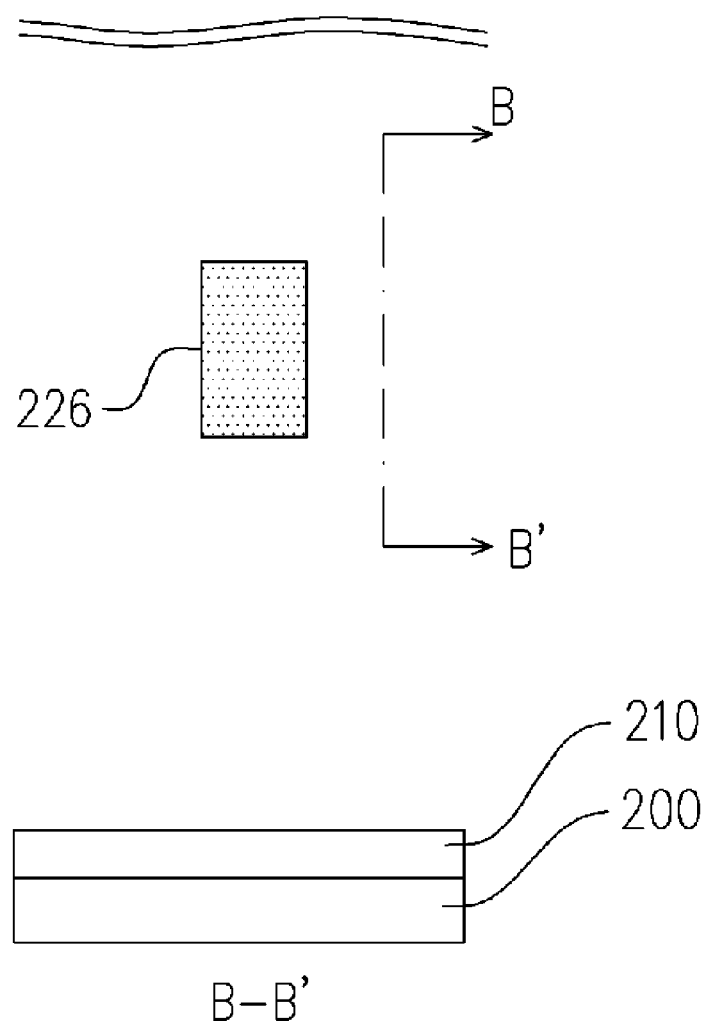
FIGS. 5A through 5E are top views illustrating a manufacturing process of one of the second ESD protective devices and one of the second shorting bar shown in FIG. 2B.

Next, referring to FIGS. 3B, 4A, and 5A, a semiconductor material layer is formed on the buffer layer 210. And then, the semiconductor material layer is patterned to form a semiconductor layer 222, a first island structure 224, and a second island structure 226. Wherein, the semiconductor layer 222, the first island structure 224, and the second island structure 226 may be made of LTPS.

Figure 3C:
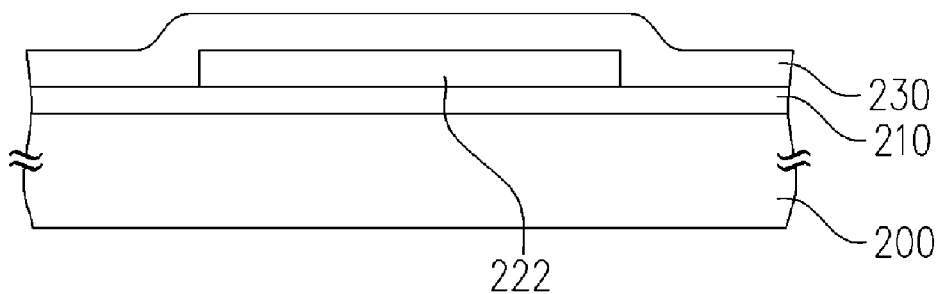
Figure 4B:
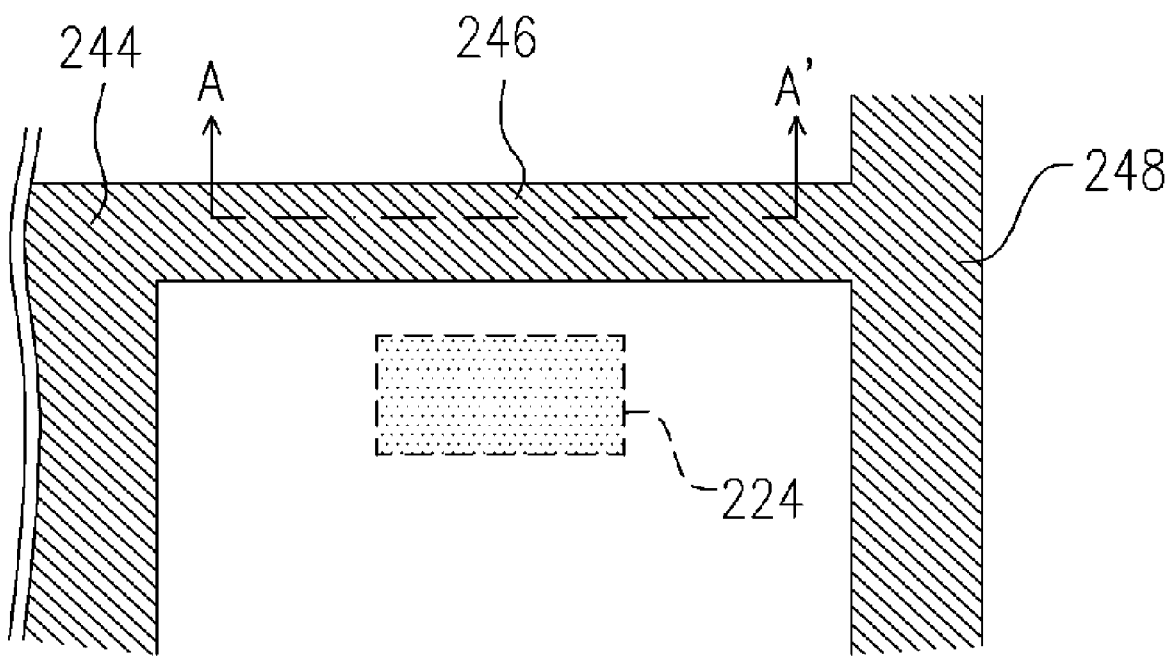
Figure 4B:
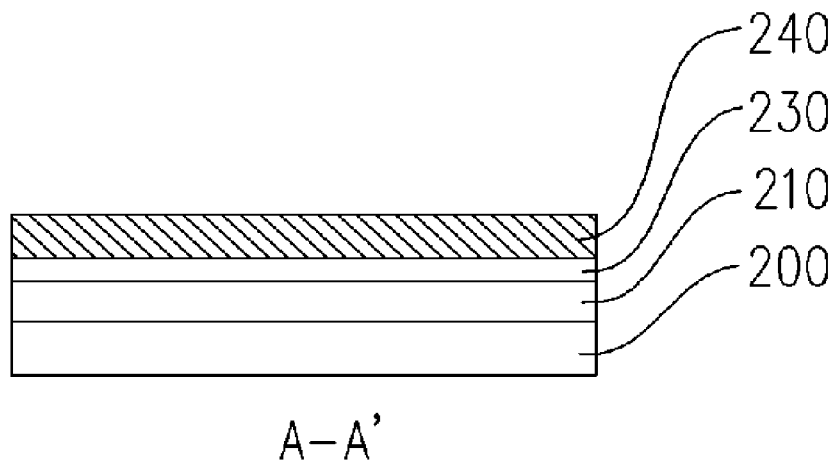
Figure 4C:
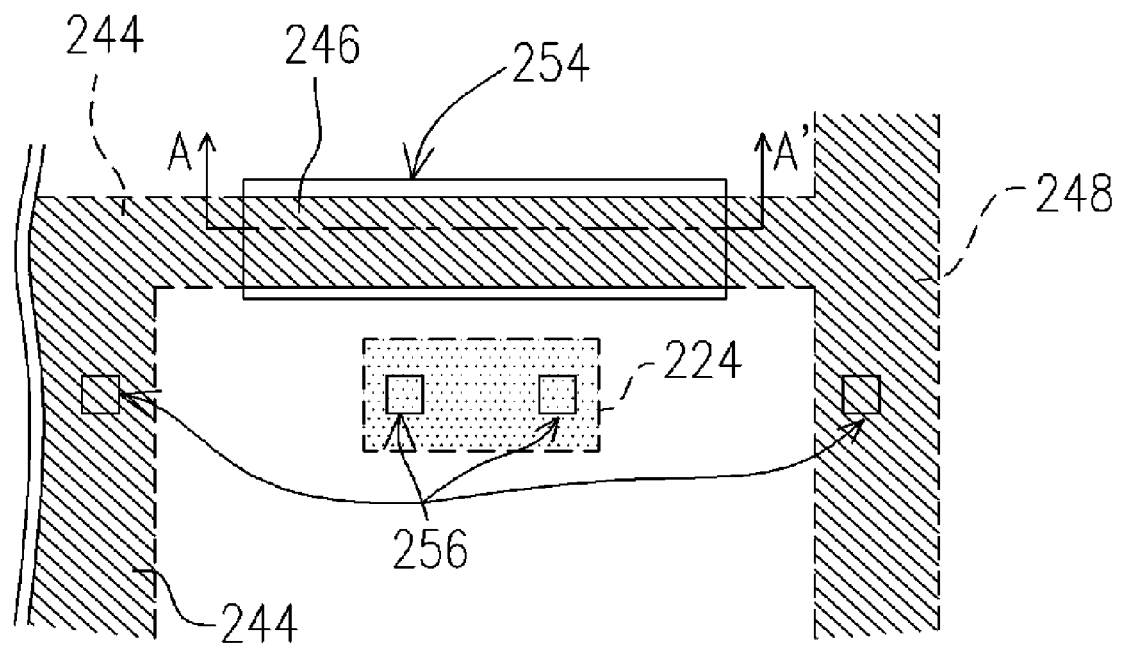
Figure 4C:
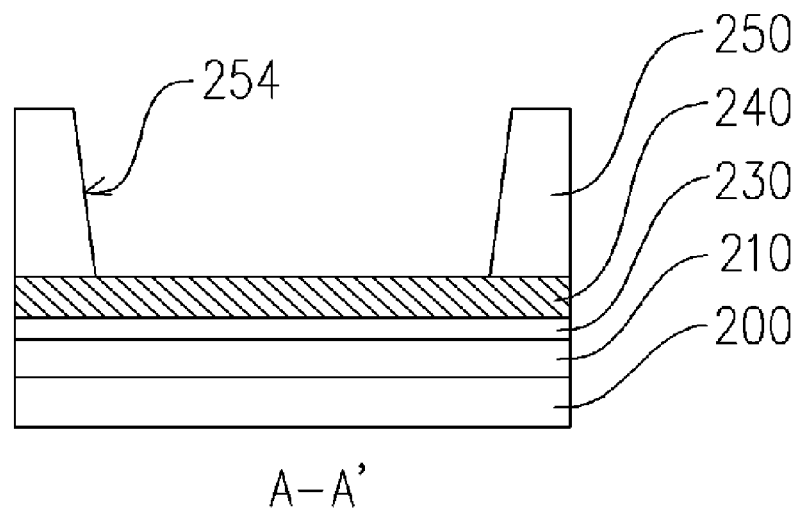
Figure 4D:
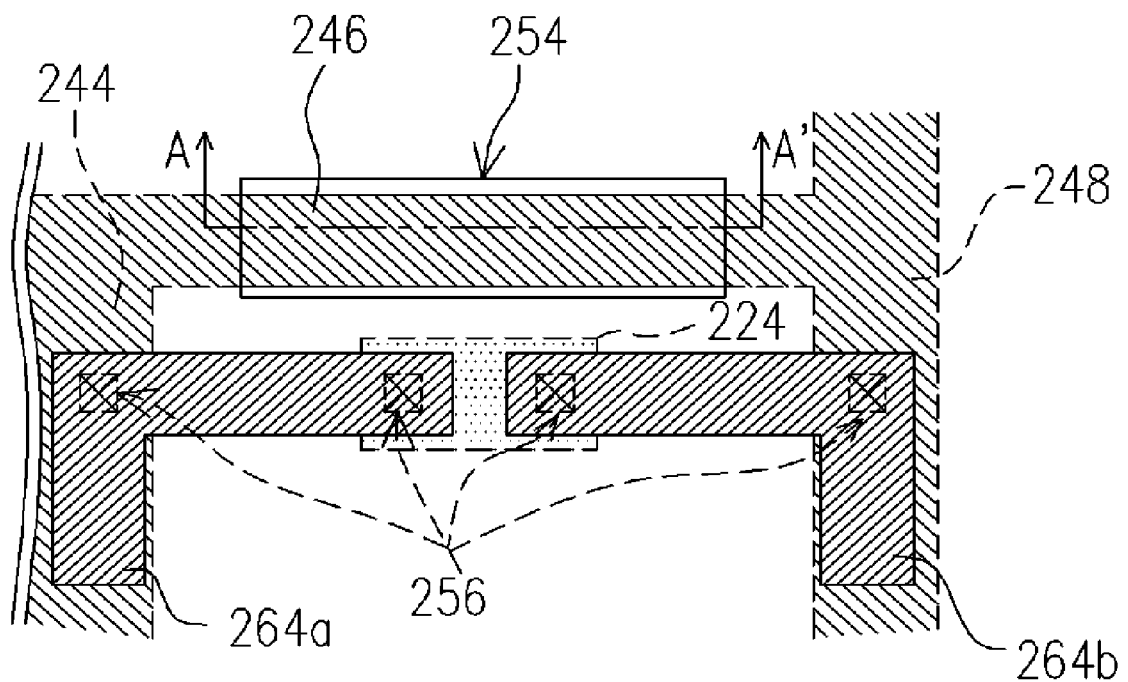
Figure 4D:
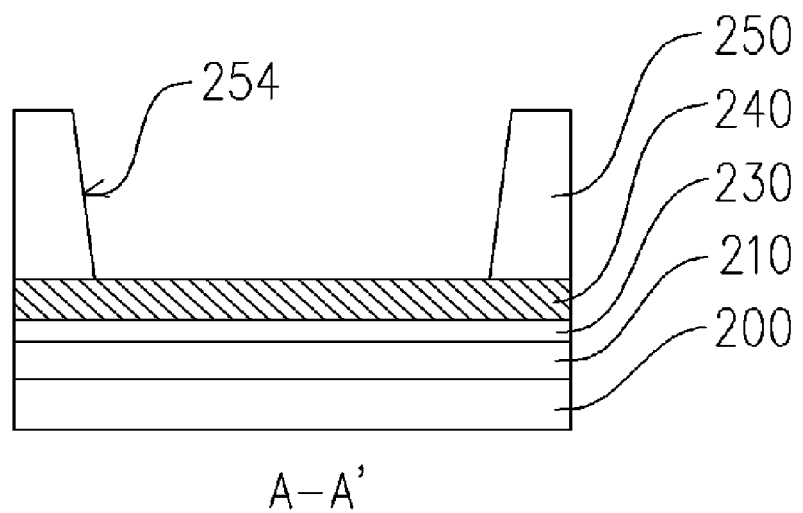
Figure 4E:
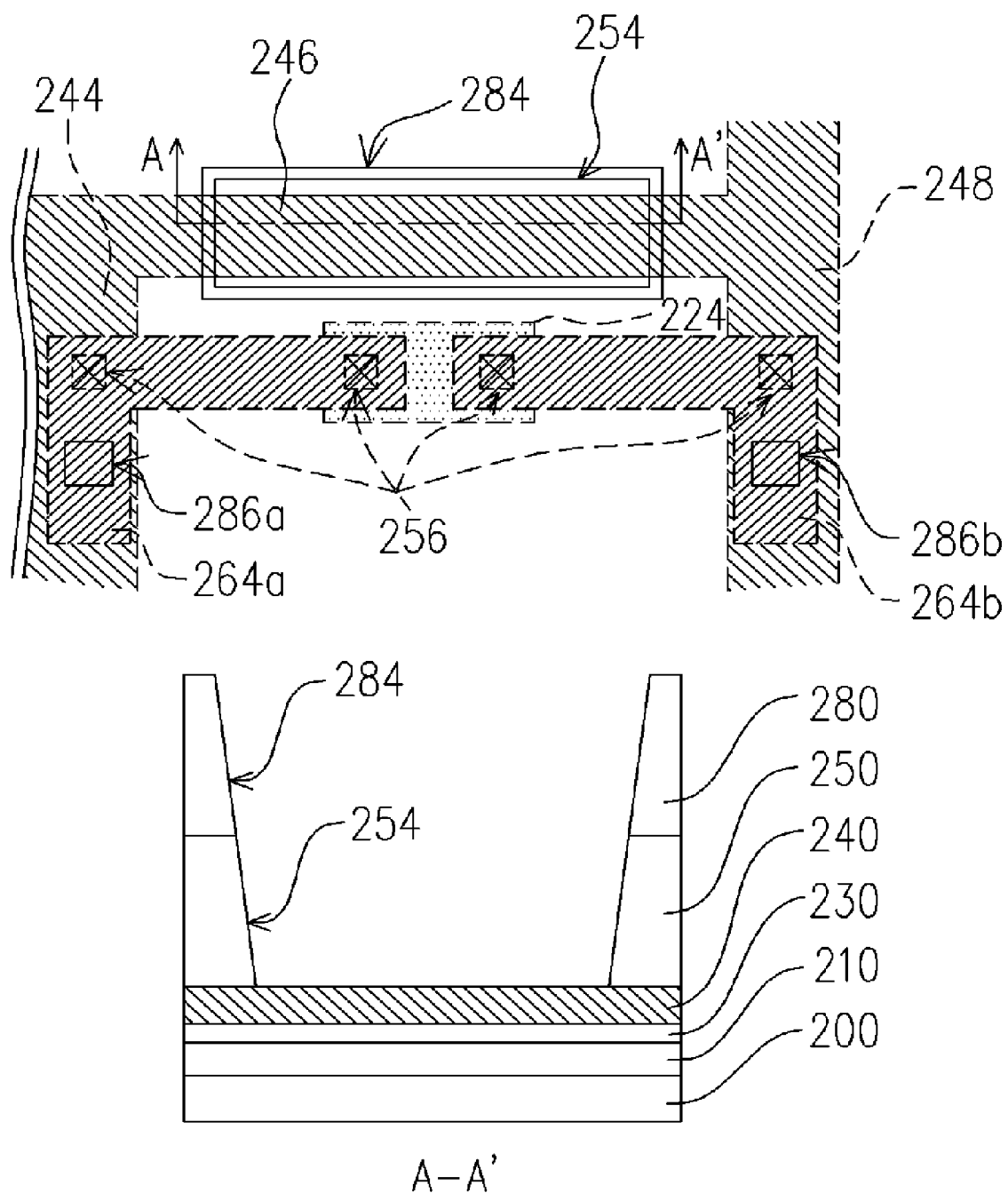
Figure 4F:
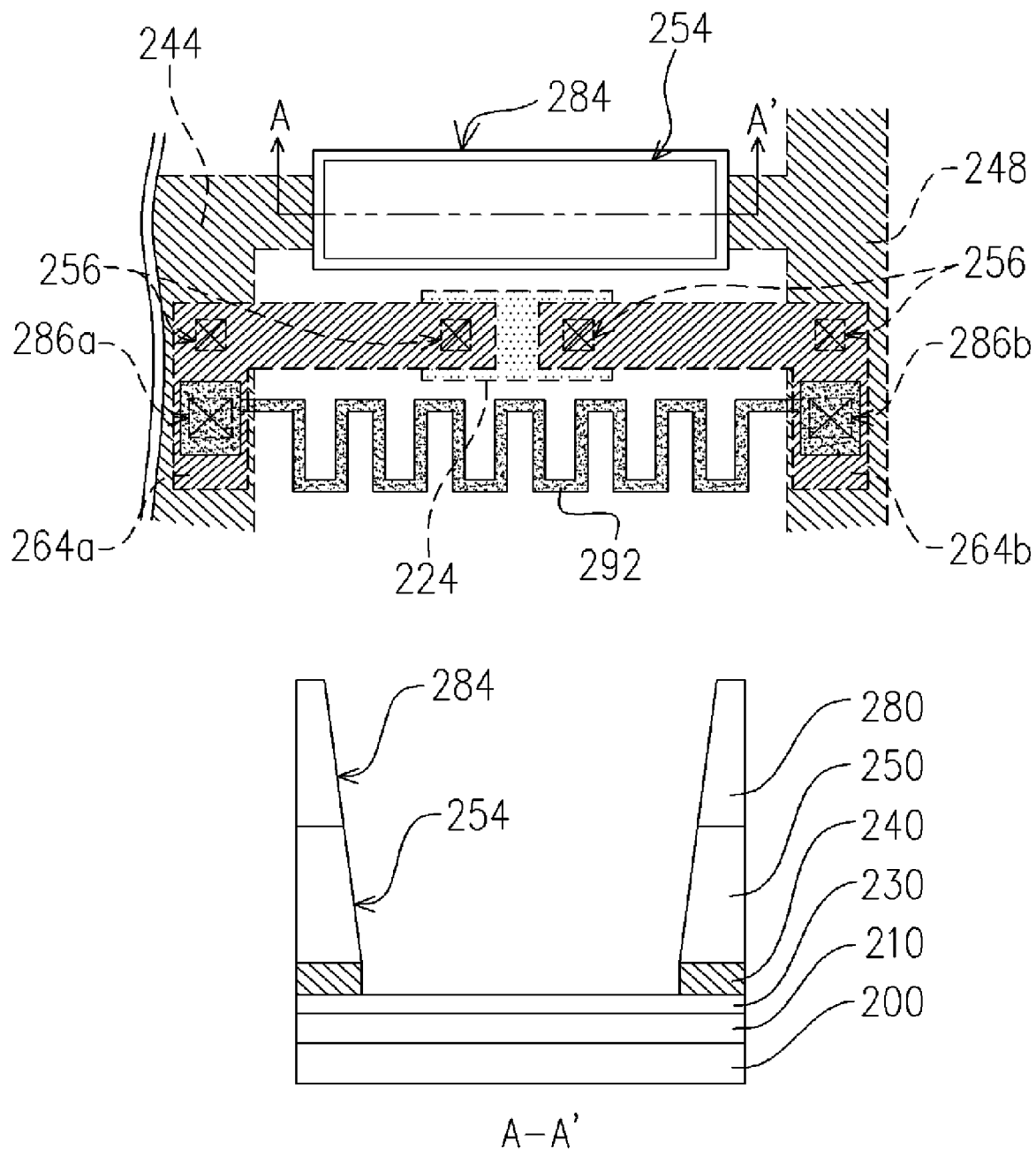
Figure 5B:
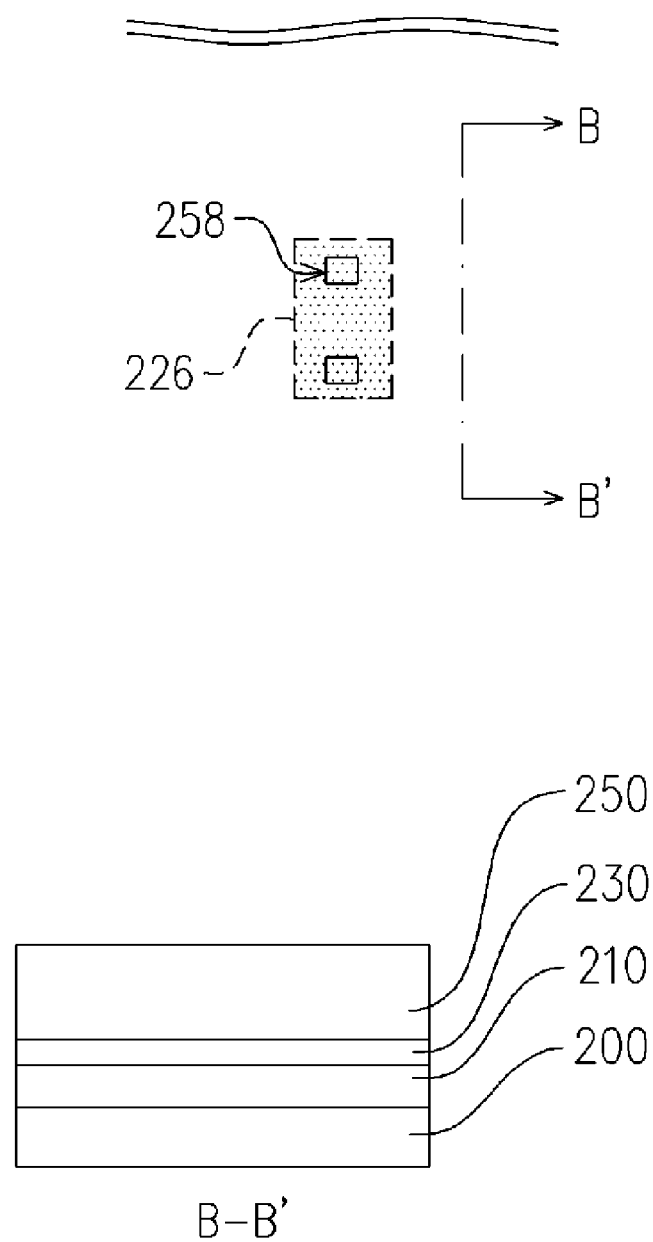

Then, referring to FIG. 3C, 4B, and 5B, a gate insulating layer 230 is formed on the substrate 200, wherein the gate insulating layer 230 covers the semiconductor layer 222, the first island structure 224, and the second island structure 226.

Figure 3D:
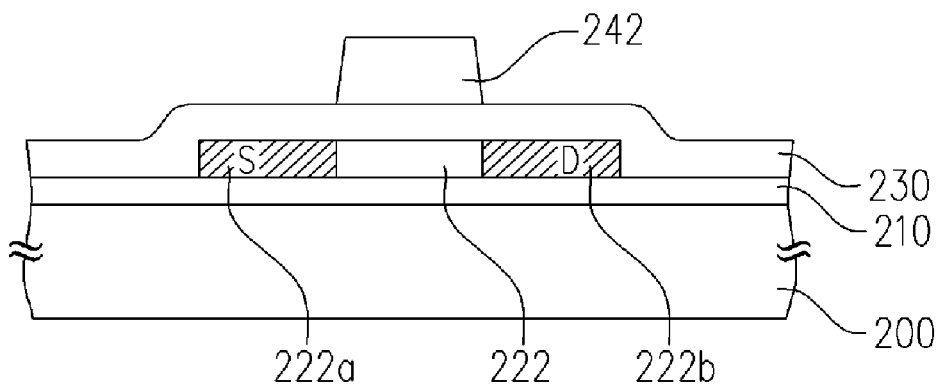

Next, referring to FIG. 3D, a first metal layer 240 is formed in the gate insulating layer 230, and is patterned to form a gate 242. Then, an ion implantation is performed to form a source/drain doped region 222a/222b in the semiconductor layer 222 by using the gate 242 as a mask. In addition, referring to FIG. 4B, a scan line 244, a first connecting part 246, and a first shorting bar 248 are formed beside the first island structure 224. An end of the first connecting part 246 is connected to the scan line 244, and the other end of the first connecting part 246 is connected to the first shorting bar 248.

Figure 3E:
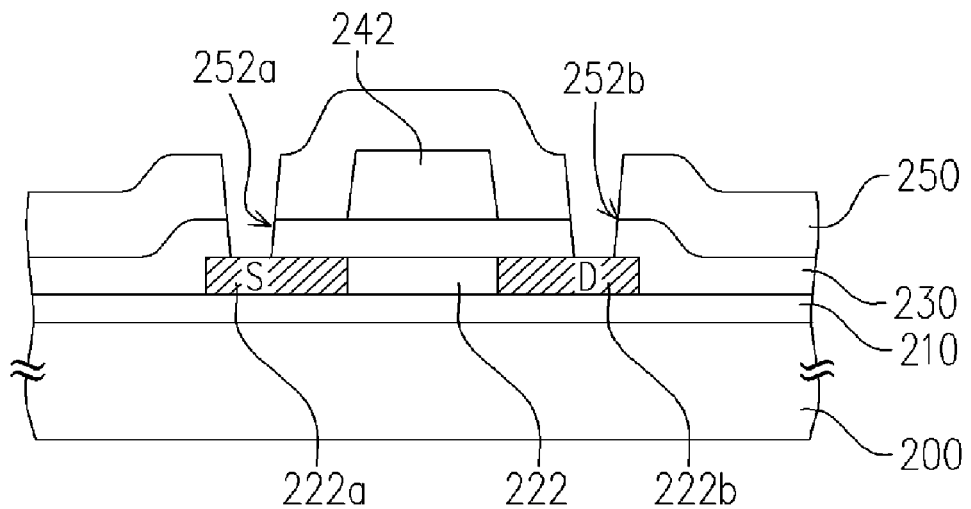

Thereafter, referring to FIG. 3E, a dielectric interlayer 250 is formed on the first metal layer 240 and the gate insulating layer 230. The dielectric inter layer 250 and the gate insulating layer 230 may be made of the same insulating material or similar insulating materials. Then, the dielectric interlayer 250 is patterned to form source/drain a contact window 252a/252b corresponding to the source/drain doped region 222a/222b. In addition, referring to FIG. 4C, a opening 254 is formed in the dielectric interlayer 250 corresponding to the first connecting part 246. And, a plurality of contact windows 256 are formed in the dielectric interlayer 250 corresponding to the scan line 244, the first island structure 224, and the first shorting bar 248. Furthermore, referring to FIG. 5B, a plurality of contact windows 258 is formed in the dielectric interlayer 250 corresponding to the second island structure 226.

Figure 3F:
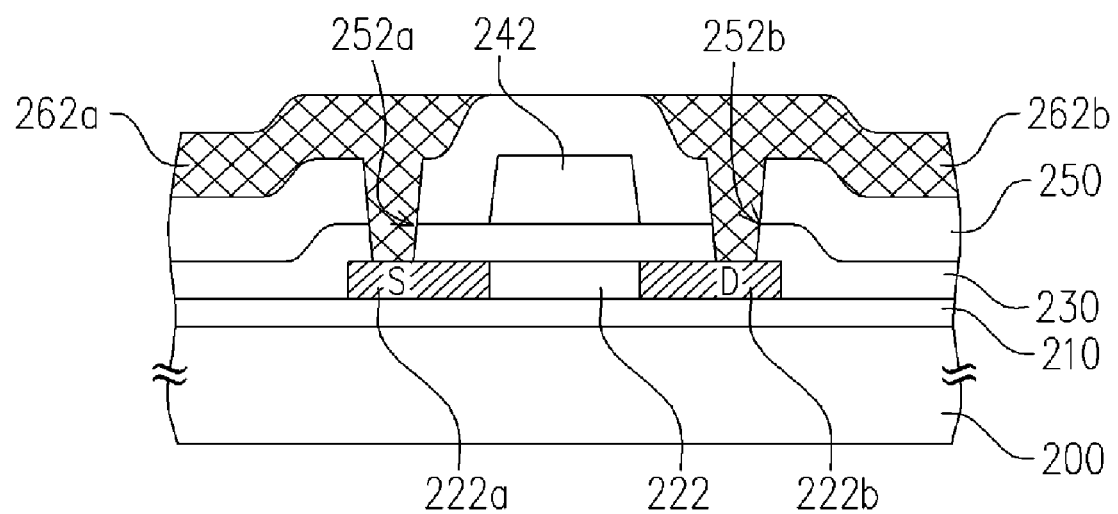

Next, referring to FIG. 3F, a second metal layer 260 is formed on the dielectric interlayer 250. And then, the second metal layer 260 is patterned to form a source/drain 262a/262b, which is electrically connected to the source/drain doped region 222a/222b via the source/drain contact window 252a/252b. And, referring to FIG. 4D, a first connecting line 264a in L-shape is formed between the first island structure 224 and the scan line 244. A second connecting line 264b in L-shape is formed between the first island structure 224 and the first shorting bar 248. Wherein, the first connecting line 264a is electrically connected between the first island structure 224 and the scan line 244 via the contact windows 256, and the second connecting line 264b is electrically connected between the first island structure 224 and the first shorting bar 248.

Figure 5C:
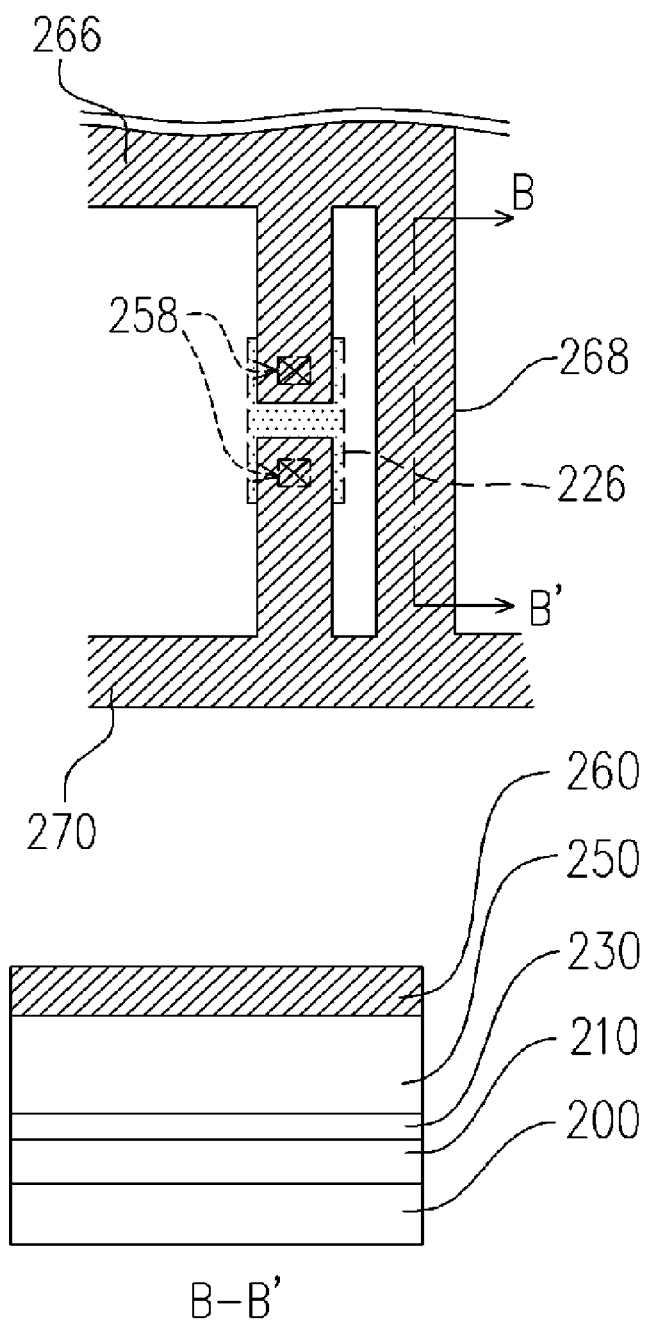
Figure 5D:
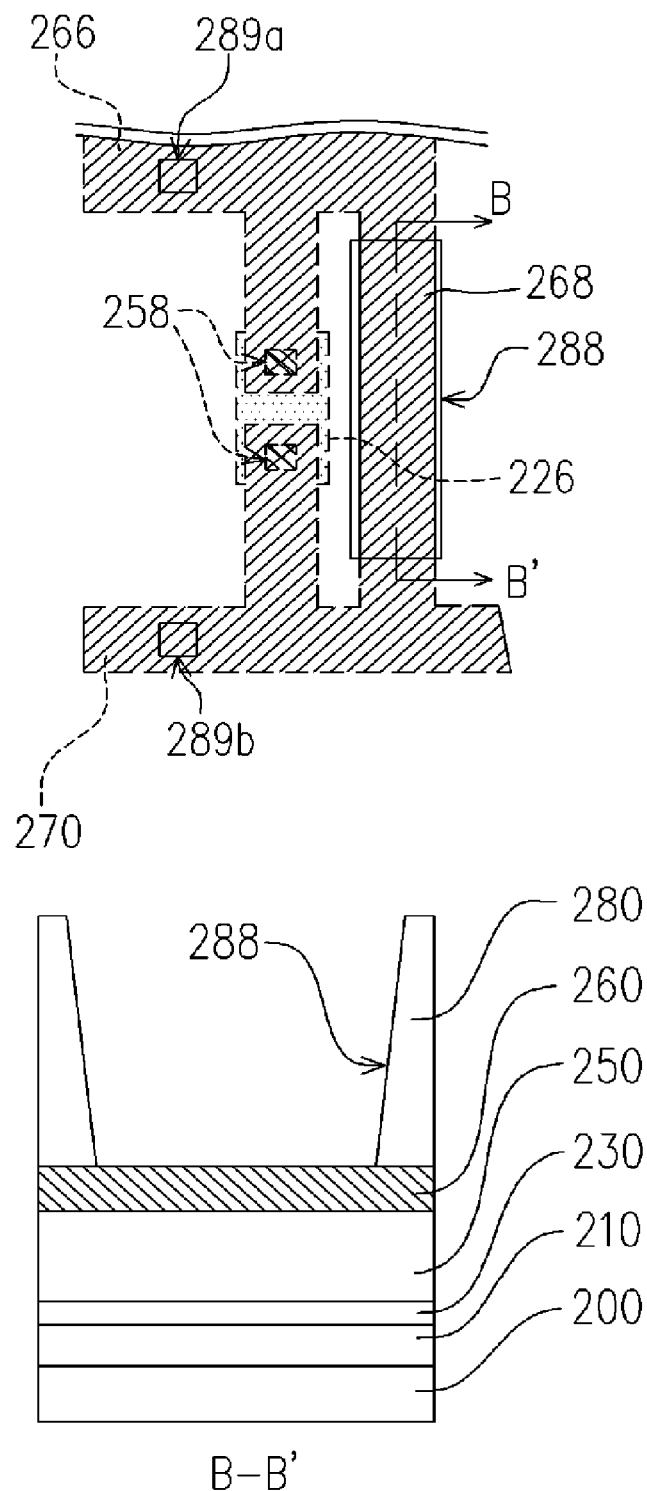

In addition, referring to FIG. 5C, a data line 266, a second connecting part 268, and a second shorting bar 270 are formed beside the second island structure 226. Wherein, an end of the second connecting part 268 is connected to the data line 266, and the other end of the second connecting part 268 is connected to the second shorting bar 270. The data lines 266 and the second shorting bar 270 extends partially over the second island structure 226, and electrically connected to the second island structure 226 via the contact windows 258.

Figure 3G:
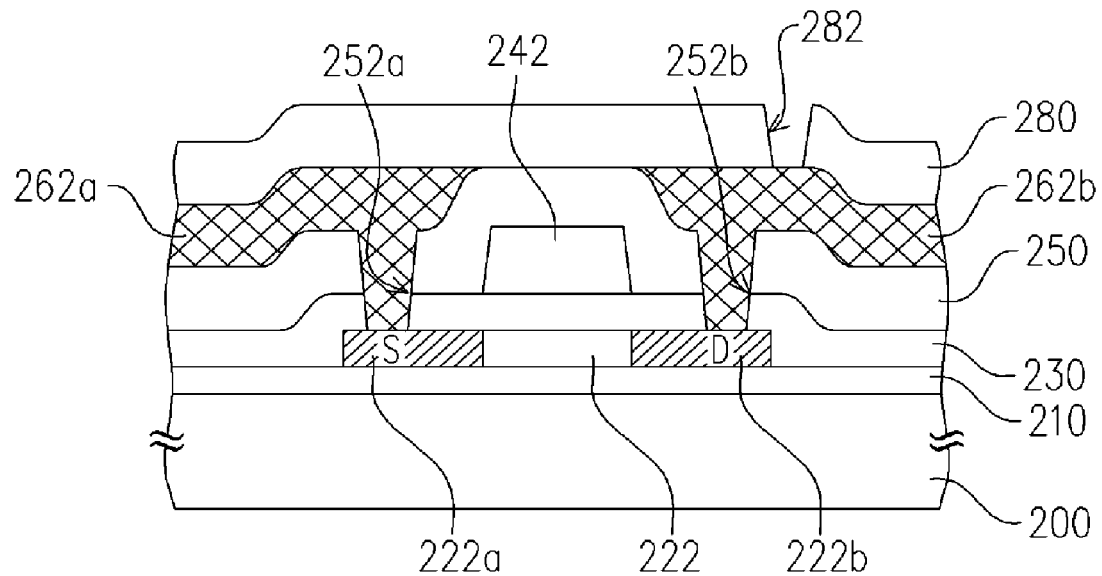

Next, referring to FIG. 3G, a passivation layer 280 is formed on the second metal layer 260 and the dielectric inter layer 250. And then, the passivation layer 280 is patterned to form a contact window 282 corresponding to the drain 262b. In addition, referring to FIG. 4E, another opening 284 is formed in the passivation layer 280 corresponding to the opening 254, and contact windows 268a and 286b are formed in the passivation layer 280 corresponding to the first connecting line 264a and the second connecting line 264b. Furthermore, referring to FIG. 5D, an opening 288, and contact windows 289a and 289b are formed in the passivation layer 280 corresponding to the second connecting part 268, the data line 266, and the second shorting bar 270 respectively.

Figure 3H:
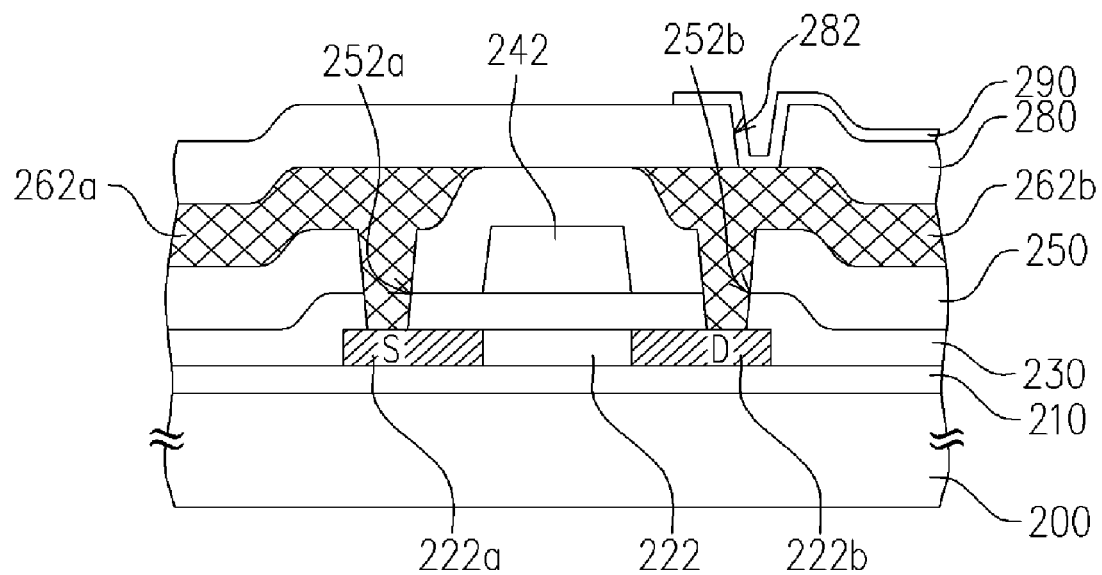

Thereafter, referring to FIG. 3H, a conductive layer is formed on the passivation layer 280, and is patterned to form a pixel electrode 290 electrically connected to the drain 262b via the contact window 282. Wherein, the conductive layer can be made of transparent conductive material, such as ITO. In addition, referring to FIG. 4F, a first resistance line 292 is formed by defining the conductive layer, wherein two ends of the first resistance line 292 are electrically connected to the first connecting line 264a and the second connecting line 264b via the contact windows 286a and 286b respectively. In the embodiment, the first resistance line 292 may take a shape of zigzag, and those skilled in the art may modify the shape of the first resistance line 292 to attain different resistance value.

Figure 5E:
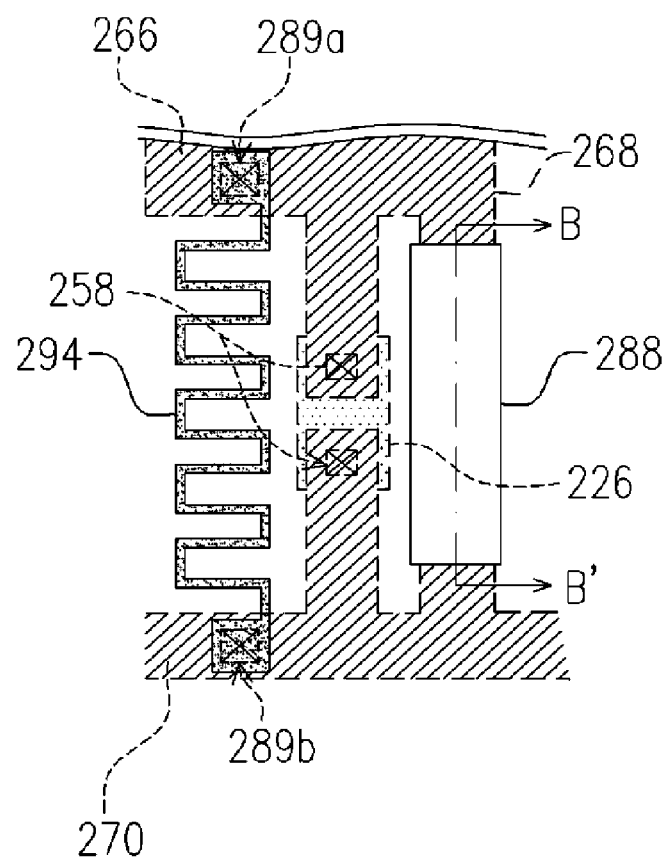
Figure 5E:
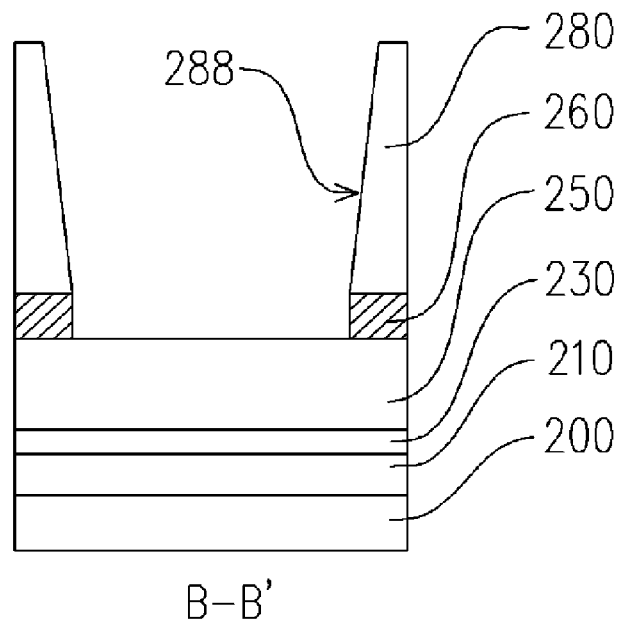

Similarly, referring to FIG. 5E, a second resistance line 294 is formed by defining the conductive layer, wherein two ends of the second resistance line 294 are electrically connected to the data line 266 and the second shorting bar 270 via the contact windows 289a and 289b respectively. In the embodiment, the second resistance line 294 may take a shape of zigzag, and those skilled in the art may modify the shape of the first resistance line 294 to attain different resistance value.

After forming the first resistance line 292 and the second resistance line 294, and before removing photo-resist, the first resistance line 292 and the second resistance line 294 in the opening 284 and the opening 288 are removed by dry etching or wet etching. Then, the photo-resist is removed, and the process for fabricating the pixel structures, the ESD protective devices, and the two shorting bars are completed. The first resistance line 292 and the second resistance line 294 will not affect the following electric test or operation. It should be noted that the manufacturing process of scan driving circuit 120 and data driving circuit 150 shown in FIG. 1 can further be integrated in the process mentioned above, but details will not be described here.

In summary, the invention can be applied to the present manufacturing process of LTPS TFT to fabricate ESD protective devices, which provides ESD protective effect on the top-gate TFT array, without any additional mask process. In addition, the ESD protective device can take effect as each metal/conductive layer is fabricated but not as the whole panel process should be accomplished. Furthermore, since a signal applied to a specific scan line or data line can be separated from others by the ESD protective device, it is impossible to detect a defective pixel.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor array, comprising:
   a substrate, having a display region and a peripheral circuit region;
   a plurality of data lines and scan lines, disposed in the display region for defining a plurality of pixel regions;
   a plurality of pixel structures, disposed in the pixel regions and driven by the data lines and the scan lines, wherein each pixel structure comprises:
      a top-gate thin film transistor, electrically connected to one of the data lines and one of the scan lines;
      a pixel electrode, disposed over and electrically connected to the top-gate thin film transistor;
   a first shorting bar, disposed in the peripheral circuit region;
   a second shorting bar, disposed in the peripheral circuit region;
   a plurality of first island structures, disposed on the substrate and between the scan lines and the first shorting bar;
   a plurality of second island structures, disposed on the substrate and between the data lines and the second shorting bar;
   a gate insulating layer, disposed on the substrate and covering the first island structures, the second island structures, and semiconductor layers of the top-gate thin film transistors;
   a dielectric interlayer, disposed on the gate insulating layer and covering the scan lines, the first shorting bar, and gates of the top-gate thin film transistors, wherein the gate insulating layer and the dielectric interlayer have a plurality of first contact windows over the scan lines, the first island structures, and the first shorting bar, and have a plurality of second contact windows over the second island structures, wherein the data lines and the second shorting bar are disposed on the dielectric interlayer and extends over the second island structures to be electrically connected to the second island structures via the second contact windows;
   a plurality of first connecting lines, disposed on the dielectric interlayer and electrically connected between the first island structures and the scan lines via the first contact windows;
   a plurality of second connecting lines, disposed on the dielectric interlayer and electrically connected between the first island structures and the shorting bar via the first contact windows;
   a passivation layer, covering the data lines, the second shorting bar, and source/drains of the top-gate thin film transistors, wherein the passivation layer has a plurality of third contact windows over the first connecting lines and the second connecting lines, and has a plurality of fourth contact windows over the data lines and the second shorting bar;
   a plurality of first resistance lines, disposed on the passivation layer and electrically connected between one of the first connecting lines and one of the second connecting lines via the third contact windows respectively; and a plurality of second resistance lines, disposed on the passivation layer and electrically connected between one of the data lines and the second shorting bar via the fourth contact windows respectively.

2. The thin film transistor array according to claim 1, wherein the gates of the top-gate thin film transistors, the scan lines, and the first shorting bar are made of a same material.

3. The thin film transistor array according to claim 1, wherein the semiconductor layers, the first island structures, and the second island structures are made of a same material.

4. The thin film transistor array according to claim 3, wherein the semiconductor layers, the first island structures, and the second island structures are made of low temperature poly-silicon.

5. The thin film transistor array according to claim 1, wherein the source/drains of the top-gate thin film transistors, the data lines, the second shorting bar, the first connecting lines, and the second connecting lines are made of a same material.

6. An electrostatic discharge protective device of a thin film transistor array, wherein the electrostatic discharge protective device is electrically connected between a scan line and a first shorting bar on a substrate, and the electrostatic discharge protective device comprises:
   a first island structure, disposed on the substrate and between the scan line and the first shorting bar;
   a gate insulating layer, disposed on the substrate and covering the first island structure;
   a dielectric interlayer, disposed on the gate insulating layer, wherein the dielectric interlayer and the gate insulating layer have a plurality of first contact windows corresponding to the scan line, the first island structure, and the first shorting bar;
   a metal layer, disposed on the dielectric interlayer and comprising a first connecting line and a second connecting line, wherein two ends of the first connecting line are electrically connected to the scan line and the first island structure respectively via the first contact windows, and two ends of the second connecting line are electrically connected to the first island structure and the first shorting bar respectively via the first contact windows;
   a passivation layer, disposed on the metal layer and having a plurality of second contact windows corresponding to the first connecting line and the second connecting line; and
   a conductive layer, disposed on the passivation layer and comprising a resistance line, wherein two ends of the resistance line are electrically connected to the first connecting line and the second connecting line respectively via the second contact windows.

7. The electrostatic discharge protective device according to claim 6, wherein the first island structure is made of low temperature poly-silicon.

8. The electrostatic discharge protective device according to claim 6, further comprising a first ground terminal, which is electrically connected to the first shorting bar.

9. The electrostatic discharge protective device according to claim 6, wherein the resistance line takes a shape of zigzag.

10. The electrostatic discharge protective device according to claim 6, wherein the conductive layer is made of metal, metal alloy, indium tin oxide (ITO), or indium zinc oxide (IZO).

11. An electrostatic discharge protective device of a thin film transistor array, wherein the electrostatic discharge protective device is electrically connected between a data line and a second shorting bar on a substrate, and the electrostatic discharge protective device comprises:
   a second island structure, disposed on the substrate and between the data line and the second shorting bar;
   an insulating layer, disposed on the substrate and covering the second island structure, wherein the insulating layer has a plurality of first contact windows exposing the second island structure, and the data line and the second shorting bar extend over the second island structure to be electrically connected to the second island structure via the first contact windows;
   a passivation layer, disposed over the data line, the second island structure, and the second shorting bar, wherein the passivation has a plurality of second contact windows exposing the data line and the second shorting bar; and
   a conductive layer, disposed on the passivation layer and comprising a resistance line, wherein two ends of the resistance line are electrically connected to the data line and the second shorting bar respectively via the second contact windows.

12. The electrostatic discharge protective device according to claim 11, wherein the second island structure is made of low temperature poly-silicon.

13. The electrostatic discharge protective device according to claim 11, wherein the insulating layer comprises a gate insulating layer and a dielectric inter layer.

14. The electrostatic discharge protective device according to claim 11, further comprising a second ground terminal, which is electrically connected to the second shorting bar.

15. The electrostatic discharge protective device according to claim 11, wherein the resistance line takes a shape of zigzag.

16. The electrostatic discharge protective device according to claim 11, wherein the conductive layer is made of metal, metal alloy, indium tin oxide (ITO), indium zinc oxide (IZO).

* * * * *